US008674866B2

(12) United States Patent
Ward et al.

(10) Patent No.: US 8,674,866 B2
(45) Date of Patent: Mar. 18, 2014

(54) INTERLEAVED RETURN-TO-ZERO, HIGH PERFORMANCE DIGITAL-TO-ANALOG CONVERTER

(75) Inventors: Christopher Ward, Utrecht (NL); Frank Van der Goes, The Hague (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/529,282

(22) Filed: Jun. 21, 2012

(65) Prior Publication Data

US 2013/0342378 A1    Dec. 26, 2013

(51) Int. Cl.
*H03M 1/66*    (2006.01)
(52) U.S. Cl.
USPC .......................................... 341/144; 341/136
(58) Field of Classification Search
USPC .................................................. 341/144, 136
See application file for complete search history.

(56) References Cited

U.S. PATENT DOCUMENTS

| 6,741,659 | B1 | 5/2004 | Chan et al. |
| 6,967,607 | B2 | 11/2005 | Melanson |
| 7,777,655 | B2 * | 8/2010 | Seedher et al. ............... 341/136 |
| 8,089,382 | B2 | 1/2012 | Pagnanelli |
| 2008/0001801 | A1 * | 1/2008 | Nhuyen ........................ 341/144 |
| 2011/0095927 | A1 | 4/2011 | Pagnanelli |
| 2011/0140946 | A1 | 6/2011 | Sheppard |
| 2012/0068867 | A1 | 3/2012 | Pagnanelli |
| 2012/0127009 | A1 | 5/2012 | Pagnanelli |

* cited by examiner

*Primary Examiner* — Jean B. Jeanglaude
(74) *Attorney, Agent, or Firm* — Thomas|Horstemeyer, LLP

(57) ABSTRACT

In one method embodiment, receiving a data signal; and converting the data signal to an analog signal over plural clock cycles, the converting comprising: during a first clock cycle of the plural clock cycles, switching on one or more first current cells of a first bank while simultaneously a second bank comprising second current cells is switched off or almost off; and during a second clock cycle of the plural clock cycles, the second clock cycle immediately subsequent to the first clock cycle, switching on one or more of the second current cells of the second bank while simultaneously the first bank is switched off or almost off.

20 Claims, 6 Drawing Sheets

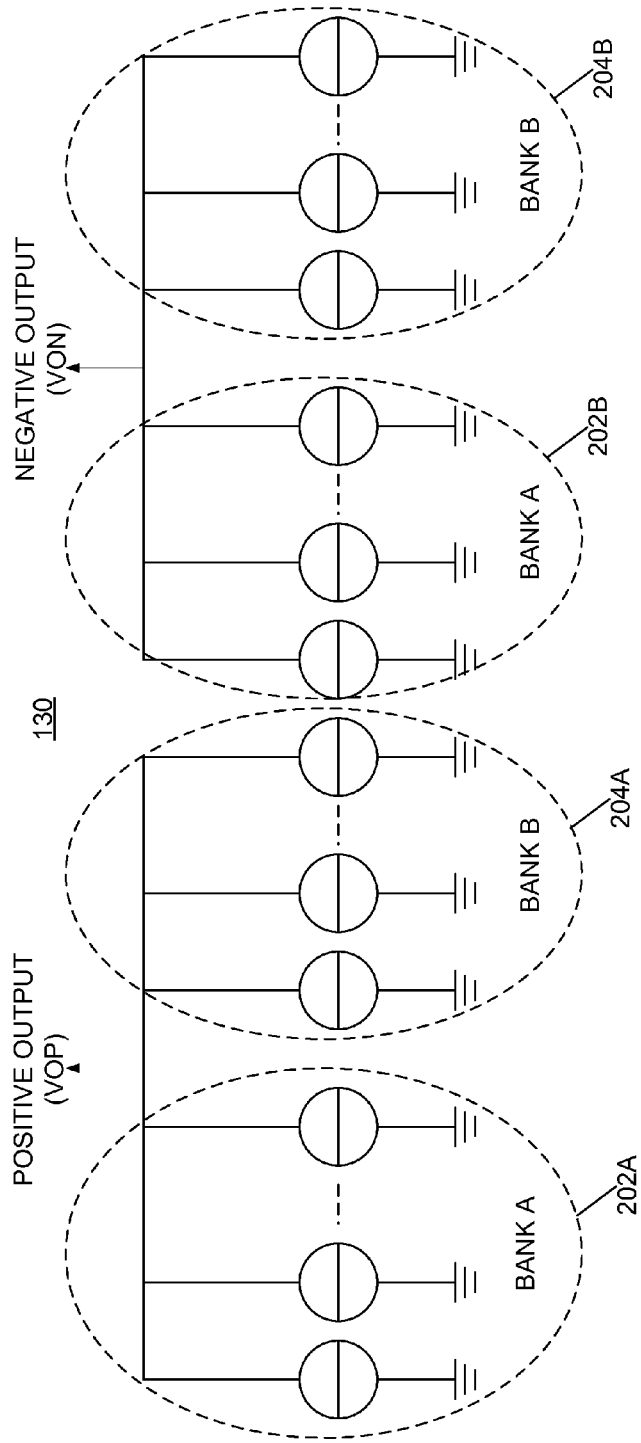
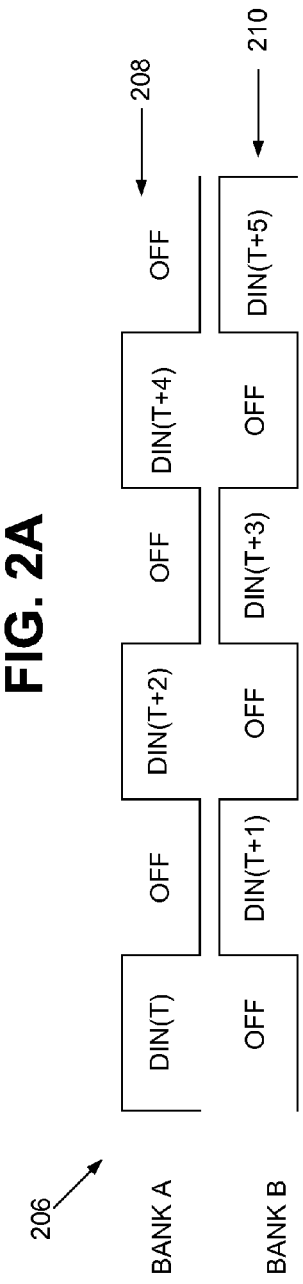
FIG. 2A
FIG. 2B

INTERLEAVED RETURN-TO-ZERO, HIGH PERFORMANCE DIGITAL-TO-ANALOG CONVERTER

TECHNICAL FIELD

The present disclosure is generally related to digital-to-analog converters.

BACKGROUND

Digital-to-analog converters (DACs) continue to undergo improvements in performance due to their ubiquitous use in wired and wireless communications. In general, the DAC receives a digital input sequence or generally input code which represents a desired output current (or output voltage for voltage-based DACs), and in the case of current-based DACs, current source switch elements are selectively turned on and off based on this code to provide the desired output signal. Some shortcomings to existing DACs may be traced to the non-linearities associated with the switching on and off of transistors of the DAC.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 2A is a block diagram that conceptually illustrates the operation of an embodiment of an IRZ high performance DAC.

FIG. 2B is a block diagram that conceptually illustrates an example clocking operation used in an embodiment of an IRZ high performance DAC.

DETAILED DESCRIPTION

Figure 1:
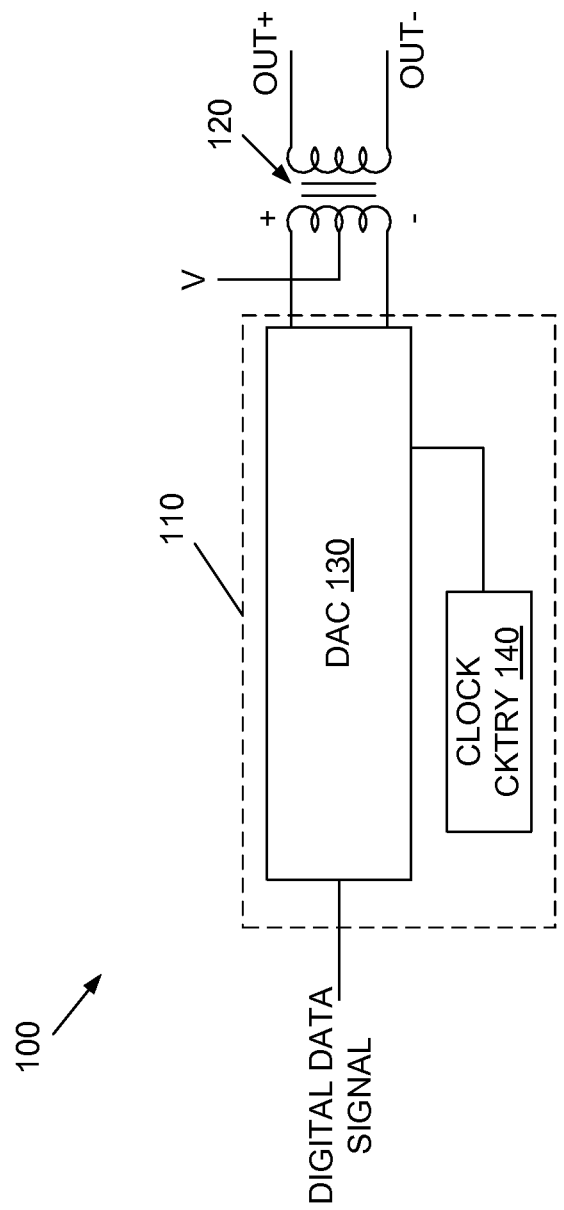
FIG. 1 is a block diagram of an example environment in which certain embodiments of an interleaved, return-to-zero (IRZ), high performance digital-to-analog converter (DAC) may be implemented.

Certain embodiments of an interleaved, return-to-zero (IRZ), high performance digital-to-analog converter (DAC) and associated methods are disclosed herein that provide low-power benefits often associated with Class B DACs and high speed characteristics typically associated with Class A DACs. For instance, in one embodiment, an IRZ, high performance DAC comprises at least two banks of current cells, each bank alternately activated according to an interleaved, return-to-zero technique, enabling a Class B DAC (or in some embodiments, other class DACs) to convert a data signal from a digital signal to an analog, current output signal without introducing, or without significantly introducing, distortion when applied to high performance systems (e.g., systems with a data signal to be processed comprising a frequency approximately at or above 1 Giga-Hertz (GHz), with high linearity (approximately at or greater than 10 bits)) and while providing a reduction in power compared to DACs traditionally used for such applications (e.g., Class A). It should be appreciated that other applications are contemplated to be within the scope of the disclosure, such as where operations are in other frequency ranges (e.g., in the megahertz range).

Digressing briefly, Class A current steering DACs are typically used for high performance applications. In general, the Class A current steering DAC comprises plural current cells, and the current output in each cell is always steered to one polarity (e.g., positive) or another (e.g., negative) based on an input code. A zero output refers to the fact that half of the current cells are steered to the positive polarity, with the other half negative, resulting in continuously consuming the same amount (e.g., maximum) of power. In other words, current cells are never turned off, but rather steered from one node (e.g., positive output) to another (e.g., negative output). Class B current steering DACs, on the other hand, consume less power, but are generally understood as representing an architecture that is unsuitable for high speed, high performance applications. In general, the current in each cell of Class B DACS is on or switched completely off. In other words, either the "positive" cell is on, or the "negative" cell is on, or neither is on (never both on). Given the non-linearities associated with transistor transitions (e.g., there is a different output curve when turned on versus turned off), distortion in high switching environments is one reason for the lack of acceptance of Class B DACs in high performance applications. Note that a zero output in a Class B DAC refers to the fact that all of the current cells are switched off, resulting in no power dissipation for such a state, and hence an improvement (in power savings) when compared to Class A DACs. Some classes of DAC designs may save power by dumping the current to a lower supply rail (e.g., lower than what is being used for the DAC).

Certain embodiments of an IRZ, high performance DAC address one or more of the shortcomings of typical Class A, B or other classes of DACs by using at least two banks of current cells (e.g., Bank A and Bank B), and alternating which bank is active for each block cycle. In other words, all current cells in one bank are off (or almost off, such as where there is a small bias current) while (simultaneously) one or more of the current cells in the other bank are driven with an input code, resulting in the removal or mitigation of distortion components typically associated with turning off current cells while maintaining signal power at the output due to the interleaved return-to-zero manner of operation.

Having summarized certain features of an IRZ, high performance DAC of the present disclosure, reference will now be made in detail to the description of the disclosure as illustrated in the drawings. While the disclosure will be described in connection with these drawings, there is no intent to limit it to the embodiment or embodiments disclosed herein. For instance, although described in the context of a DAC application for an Ethernet communications device, other systems and devices that use or may use a DAC are also contemplated to be within the scope of the disclosure, such as tuner applications, cable CMTS, wireless mobile devices (e.g., with coupling to an antenna, replacing the power amplifier), among others. Further, although the description identifies or describes specifics of one or more embodiments, such specifics are not necessarily part of every embodiment, nor are all of the various stated advantages necessarily associated with a single embodiment. On the contrary, the intent is to cover all alternatives, modifications and equivalents included within the spirit and scope of the disclosure as defined by the appended claims. Further, it should be appreciated in the context of the present disclosure that the claims are not necessarily limited to the particular embodiments set out in the description.

Referring now to FIG. 1, shown is an example environment in which certain embodiments of an IRZ, high performance DAC may be employed. In particular, FIG. 1 shows an output stage 100 of a communications device. In an embodiment, the output stage 100 is implemented within an Ethernet communications device configured to support 10 Gigabit Ethernet and legacy Ethernet modes of 10BASE-T (10 Mbit/s), 100BASE-T (100 Mbits/s), and 1000BASE-T (1 Gbit/s), for example. The output stage 100 includes a single, current-mode line driver 110 configured to support multiple communication standards, such as the Ethernet standards noted above, and a center-tapped transformer 120. In general, a line driver is an amplifier that is configured to increase the strength of a received analog or digital signal to be transmitted by driving a transmission line with the received signal at a higher than normal signal level. This increases the transmission quality of the signal over the length of the cable, allowing the signal to be properly received by a device on the other end.

In one example operation, the current-mode line driver 110 is configured to receive a digital input signal to be transmitted and to provide a differential analog output signal corresponding to the received digital input signal. The current-mode line driver 110 specifically provides the differential analog output signal to a primary side of the transformer 120 at the appropriate signaling levels and output power dictated by the current communication standard in operation. Sufficient output power is needed to drive transmission lines (e.g., unshielded twisted pair lines, optical fiber, etc.) of a predetermined maximum length that are coupled to differential output nodes OUT+ and OUT− at the secondary side of transformer 120 and to overcome noise introduced during transmission. The transformer 120 aids in the rejection of common-mode signals present at the output of line driver 110 and provides dc isolation between the output of line driver 110 and the load presented by the transmission lines coupled to differential output nodes OUT+ and OUT.

As further illustrated in FIG. 1, the line driver 110 includes an IRZ, high performance DAC 130, and clocking circuitry 140. A digital data signal is passed to the IRZ, high performance DAC 130. The IRZ, high performance DAC 130 includes plural banks of current cells to steer the output current to either the positive or negative end of the primary side of transformer 120 based on the digital signal received. In other words, the IRZ, high performance DAC 130 includes current source outputs and the center-tap of the transformer 120 is coupled to a voltage supply (i.e., VDD=V volts, sometimes referred to as Vcenter-tap or Vct).

Having described an example environment in which an embodiment of an IRZ, high performance DAC 130 may be implemented, attention is directed to FIGS. 2A and 2B, which conceptually illustrate the operation of an embodiment of an IRZ high performance DAC. Referring to FIG. 2A, shown is an embodiment of an IRZ, high performance DAC 130 comprising a first bank 202A and 202B (collectively, 202) of $2^{N-1}$ current cells and a second bank 204A and 204B (collectively, 204) of $2^{N-1}$ current cells. The two banks 202A (bank A) and 204A (bank B) are connected to a positive output (also referred to herein as Vop, as described below), and each current cell can be switched on or off. The number of current cells switched on is set by a DAC digital input code. Likewise, the two banks 202B (bank A) and 204B (bank B) are connected to a negative output (also referred to herein as Von, as described below), and each current cell can be switched on or off (where the number of current cells switched on is set by a DAC digital input code). Only one bank (bank A or bank B) has current cells on at a time (e.g., during a given clock cycle). Bank A 202 and bank B 204 alternate each clock cycle. For instance, if bank A 202 has one or more current cells on in a previous clock cycle, in a new clock cycle (subsequent), all current cells that were on in the previous clock cycle (in bank A 202) are shut off, and a new set (of one or more current cells) are activated in bank B 204. In other words, one or more current cells in one bank turn off while, simultaneously, one or more cells in the other bank turn on—ensuring the output signal within a first Nyquist band remains unmodified, as described further below. Note that the center tap voltage of the transformer (V in FIG. 1) becomes a common mode output voltage, because Vop and Von, when outputting zero, may actually be equal to V, and may also swing symmetrically around V.

Digressing briefly, it is noted that a conventional Class B current steering DAC has just one of the banks (e.g., bank A) configured for steering current in the positive and then negative direction. In the example embodiment depicted in FIG. 2A, bank A 202 is essentially duplicated and now referred to as bank B 204.

Referring to FIG. 2B, shown are example clocking signals 206 for each of the banks A 202 and B 204 that illustrate the interleaving return-to-zero technique employed by certain embodiments of an IRZ, high performance DAC 130. In particular, the clocking signal 208 for bank A 202 is shown at the top of FIG. 2B, and the clocking signal 210 for bank B 204 is shown in aligned relationship below the clocking signal 208. Din(t) represents the digital input DAC (input code) that selectively activates the current cells of a given bank for a given clock cycle. As illustrated, Din(t) represents the input code input for a first clock cycle, where one or more current cells of bank A 202 are activated while the current cells of bank B 204 are off. In an immediately subsequent clock cycle, all of the current cells of bank A are off while one or more current cells of bank B are activated according to DAC input code Din(t+1). In the next clock cycle, one or more of the current cells of bank A are activated according to input code Din(t+2) while the current cells of bank B 204 are off. This process continues. In other words, the banks (bank A 202 or bank B 204) are alternately activated each clock cycle, where one or more cells are driven with an input code while at the same time, all of the current cells of the other bank are off (or close to off in some embodiments).

Figure 3A:
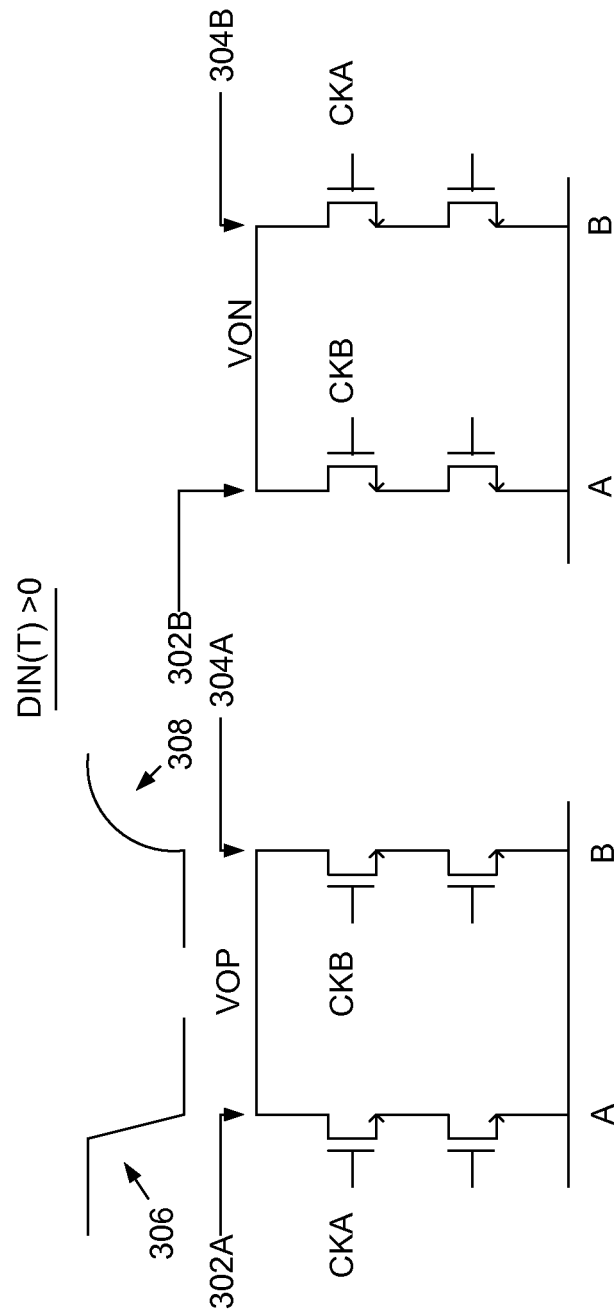
FIGS. 3A-3C are block diagrams that further illustrate example operations of an embodiment of an IRZ high performance DAC.
Figure 3B:
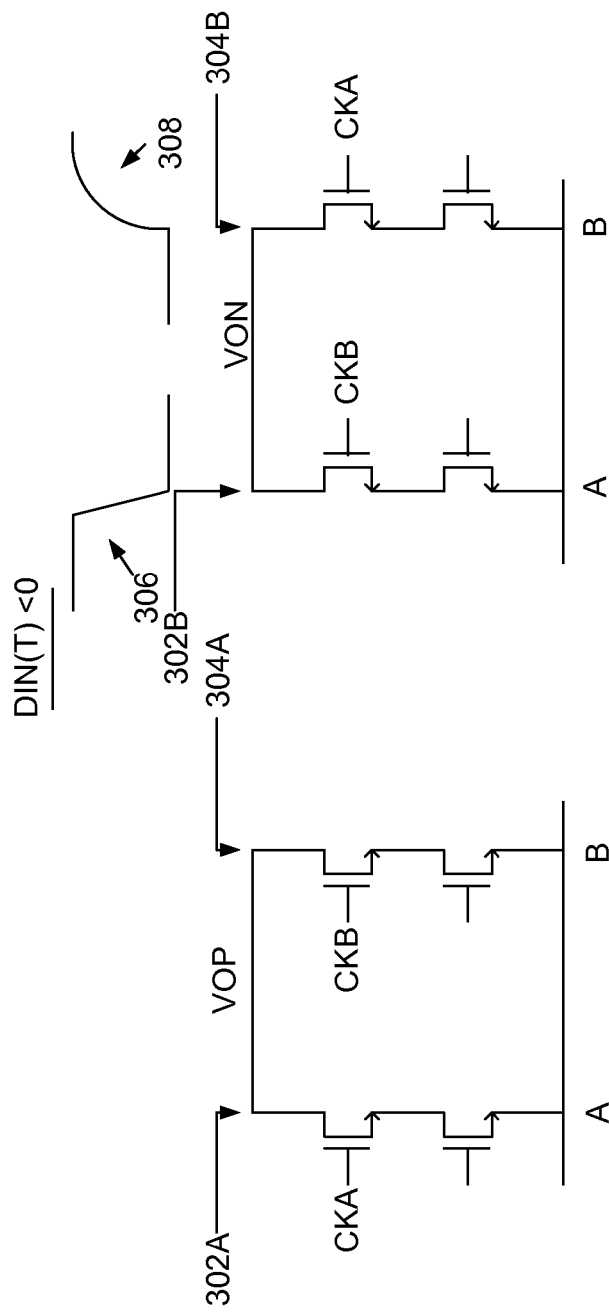
Figure 3C:
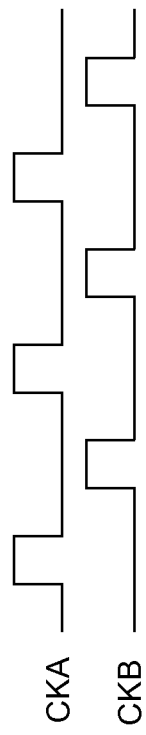

FIGS. 3A-3C, and the associated description below, provide further insight into certain embodiments of an IRZ, high performance DAC 130 and the effects of transistor transients. Although described below using two banks (A and B), it should be appreciated within the context of the present disclosure that additional, like-configured banks may be employed in some embodiments. Referring to FIG. 3A, which represents a Din(t)>0 for a give clock cycle, shown is an example configuration of a bank A 302 (e.g., 302A, 302B) and bank B 304 (e.g., 304A, 304B). The positive output (Vop) is shown connected in common to bank A 302A and bank B 304A. The negative output (Von) is shown connected in common to bank A 302B and bank B 304B. The current cells for each bank are shown in a stacked transistor configuration, where the top transistor may serve as a switch (e.g., an NMOS) and the bottom transistor may serve as a current source (e.g., an NMOS). In some embodiments, the current cell may be configured as a single cascode (e.g., stacked NMOS arrangement approaching an ideal current source where the top NMOS transistor assists the bottom NMOS transistor to have a higher output impedance), among other arrangements known to those having ordinary skill in the art. For instance, switching may be achieved in some embodiments in one of a plurality of different ways (e.g., other switching mechanisms), such as tying the gate voltage of a transistor to zero, among other approaches. In some embodiments, the transistors may be implemented in a pull-only type operation (e.g., from a transformer with a center tap), and in some embodiments, a push-pull mechanism may be employed. As an example of the latter approach, the same banks are duplicated on the top (and implemented using, for instance, PMOS transistors), where the combination of NMOS and PMOS transistors collectively comprise a bank. Also shown are example transient responses by each transistor when switching off 306 and switching on 308. Note that these transients are for illustration only, and other types of transients are contemplated to be within the scope of the disclosure. In general, the transients 306 and 308 are illustrative of the fact that adding current provides a different transient than subtracting current, and hence are not the inverse of one another since transistors are not ideal.

Digressing briefly, transient effects corresponding to having turn-on transients (linear with step size) different than turn-off transients are generally linear in Class A DACs since no harmonic components are added within the first Nyquist band, affecting only higher-order folds above Nyquist. However, in Class B DACs, harmonic components are added within the first Nyquist band, and hence the transient effects result in a non-linear effect. FIGS. 3A-3C and the corresponding description explain/illustrate how certain embodiments of IRZ high performance DACs 130 overcome the challenges of non-linearity.

Referring again to FIG. 3A, for a prior clock cycle input, (t−1), Vop-A cells are turned on. Then at time (t), Vop-A cells turn off while simultaneously Vop-B cells turn on. The transients 306 and 308 are those corresponding to the turned-off (Vop-A) and turned-on (Vop-B) cells, respectively.

In FIG. 3B, for a prior clock cycle input, (t−1), Von-A cells are turned on. Then at time (t), Von-A cells turn off while simultaneously Von-B cells turn on. The transients 306 and 38 once again illustrate the turn on 308 (Von-B) and turn off 306 (Von-A) transients. Without the techniques employed by certain embodiments of the IRZ high performance DAC 130, these error transients create nonlinearities at the DAC output, which limits performance. However, by using a second bank of current cells, and forcing these current cells to turn off while switching to a new set of current cells, a turn on transient is added (e.g., proportional to the number of cells turning on [Din(t)]) and also a turn off transient is added (e.g., proportional to the number of cells turned off [Din(t−1)]), enabling the nonlinearity in the first Nyquist band to disappear.

FIG. 3C illustrates the clocking signals for clocks A and B in associated with the Vop and Von arrangement shown in FIGS. 3A and 3B, where the two banks A and B are clocked alternately so that only one bank is on at a time.

Figure 4:
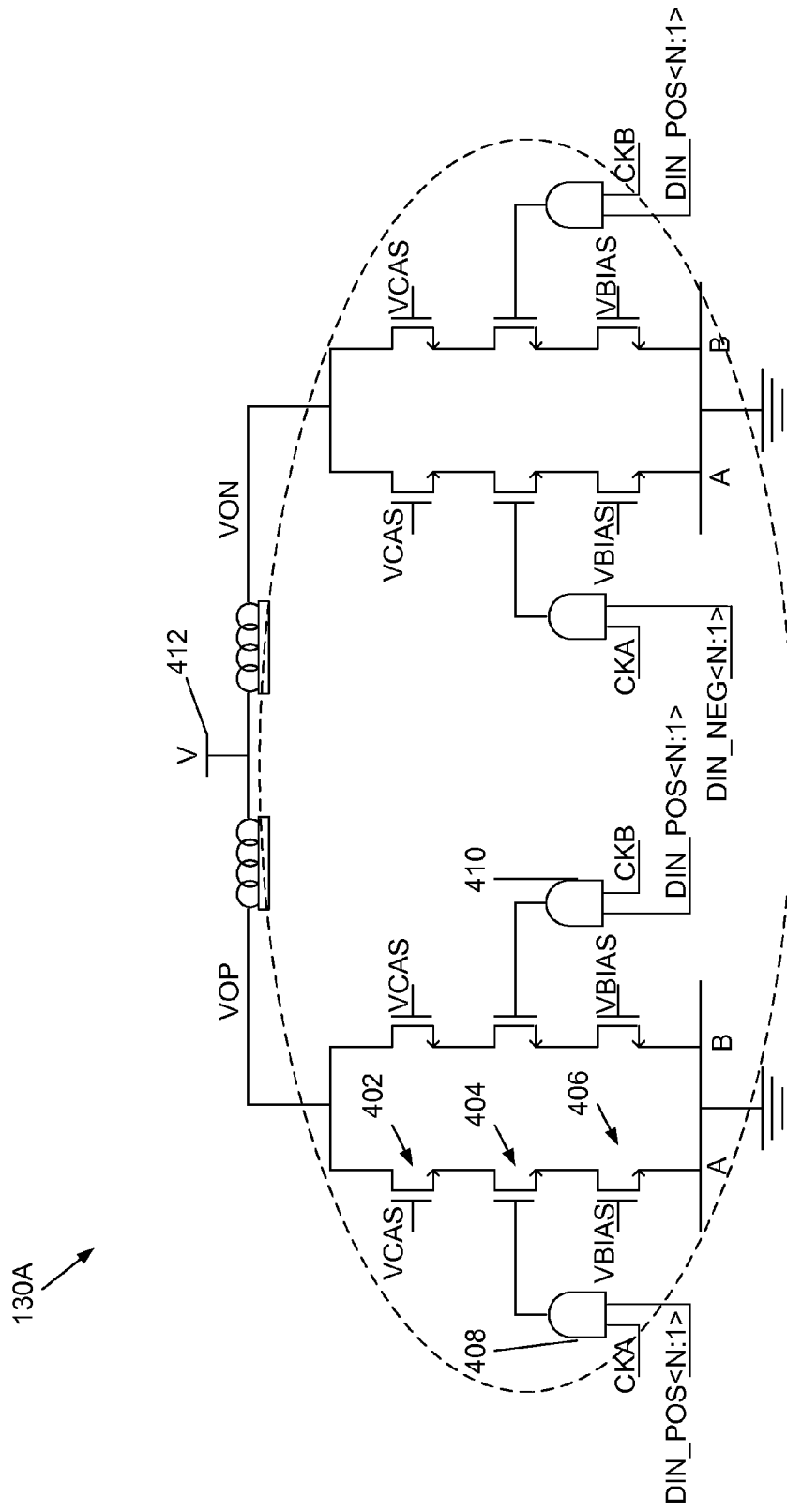
FIG. 4 is a schematic diagram of an embodiment of an IRZ high performance DAC.
Figure 5:
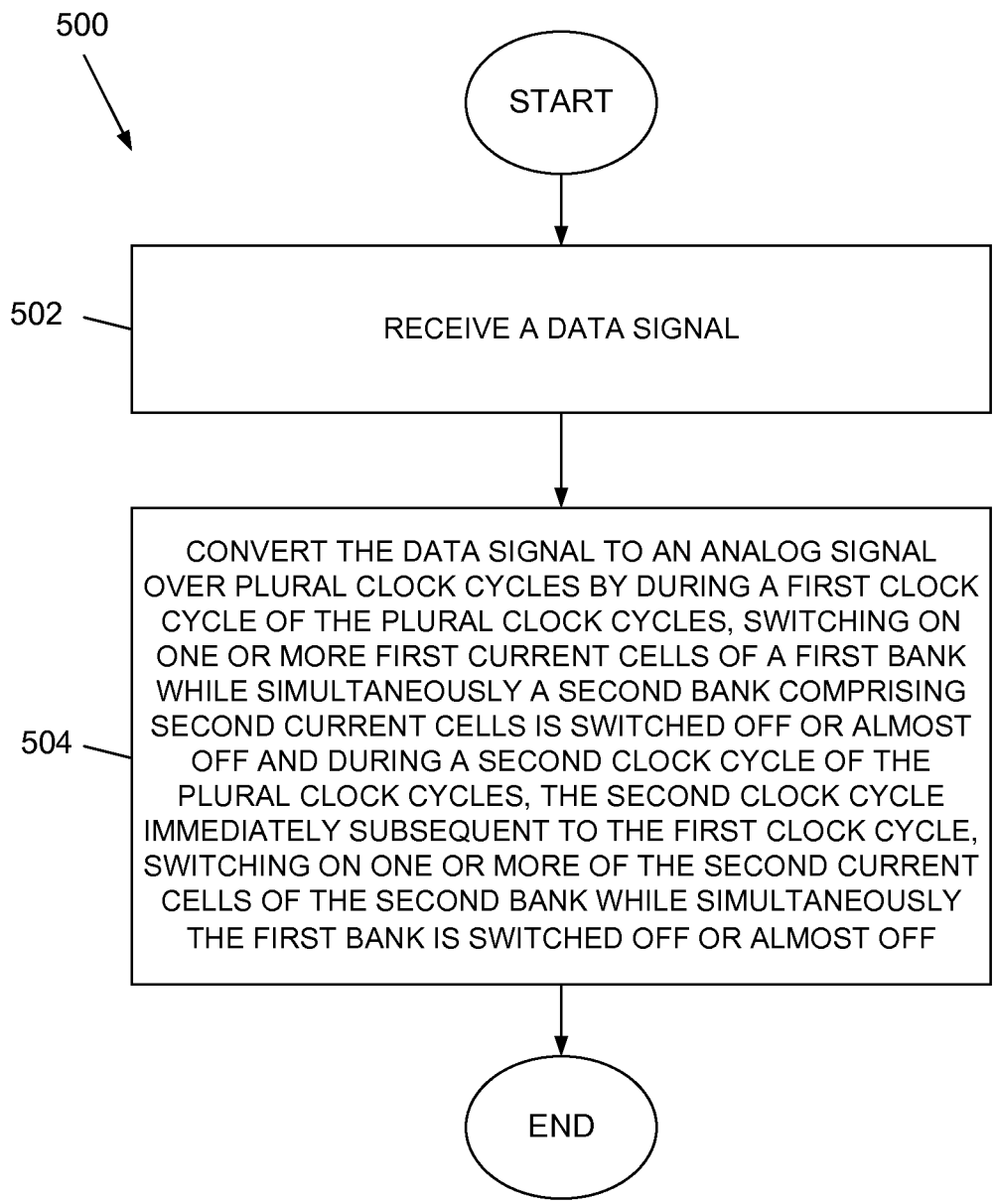
FIG. 5 is a flow diagram that illustrates one embodiment of a method of providing digital-to-analog conversion using an IRZ high performance DAC.

FIG. 4 is a schematic diagram of an embodiment of an IRZ high performance DAC 130A. It should be appreciated by one having ordinary skill in the art that the example IRZ high performance DAC 130A is one example circuit among many different types of circuits that may be used in one or more embodiments, and hence different circuit configurations and/or transistor types may be used in some embodiments and are contemplated to be within the scope of the disclosure. As shown in this example embodiment, the IRZ high performance DAC 130A comprises two banks of current cells (e.g., bank A and bank B) coupled to positive (Vop) and negative (Von) outputs. Referring to bank A on the positive output side, the branch comprises a cascode transistor 402 in series with a switching transistor 404, which is in series with a current source transistor 406, the latter coupled to ground. The cascode transistor 402 receives input voltage Vcas. As is known, the transcode transistor 402 increases the output impedance of the source transistor 406. The current source transistor 406 receives as input, Vbias. A similar arrangement of transistors is found in the B bank corresponding to the positive output, as well as the A and B banks corresponding to the negative (Von) outputs, and hence discussion where there is commonality in structure among the banks/outputs is omitted here for brevity. The switching transistor 404 is driven with a digital input code (e.g., Din_pos<N:1>) through an AND gate 408, which selects which side is on at any time based also on the clock signal, CKA, inputted to the AND gate 408. Note that an AND gate 410 for the B bank of the positive output comprises clock signal input, CKB and Din_pos<N:1>, with similar functionality as described above. The switching transistors of the A and B banks are driven by a digital input code Din_neg<N:1> in similar manner. It should be appreciated within the context of the present disclosure that the digital input code is understood as segmented into Din_pos and Din_neg, representing current cells on the positive and negative side respectively of the IRZ high performance DAC 130A. Such segmenting should be understood by those having ordinary skill in the art as requiring pre-processing to split the incoming digital signal into the aforementioned signals in a manner suitable to drive a Class B DAC. Note that a load 412 is shown, represented by the primary coil of a transformer having a center tap voltage, V, acting as the supply voltage for the IRZ high performance DAC 130A. In view of the above, it should be appreciated within the context of the present disclosure that one method embodiment, shown in FIG. 5 and referred to as method 500, comprises receiving a data signal (502). For instance, the data signal may comprise a frequency approximately at or above 1 Giga-Hertz (GHz) (502). As mentioned above, it should be appreciated that other frequency applications are contemplated to be within the scope of the disclosure. In other words, as described previously, an IRZ high performance DAC 130 provides power-reducing performance of Class B DACs with the high speed (e.g., approximately at or exceeding 1 GHz, among others) and high linearity (e.g., approximately at or exceeding 10 bits) performance often associated with Class A DACs. The method 500 further comprises converting the data signal to an analog signal over plural clock cycles (504). For instance, the converting comprises: during a first clock cycle of the plural clock cycles, switching on one or more first current cells of a first bank while a second bank comprising second current cells is switched off or almost off. As described above in association with FIGS. 3A and 3B, during a given clock cycle, Vop-B or Von-B is on (depending on Din(t) for that cycle), while the other bank (bank A) is turned off. Further, during a second clock cycle of the plural clock cycles, the second clock cycle immediately subsequent to the first clock cycle, switching on one or more of the second current cells of the second bank while the first bank is switched off or almost off. For instance, referring to FIGS. 3A-3B, during a subsequent clock cycle (see, e.g., FIG. 3C), Vop-A or Von-A is on (depending on Din(t+1) for that subsequent cycle), and the other bank (bank B) is off.

In some embodiments, the method 500 is implemented in a Class B DAC according to the above disclosure, and in some embodiments, the method 500 is implemented in a Class AB DAC. Although the current cells are described as being turned off, in some embodiments, the method 500 may be employed where the current cells are not fully turned off. For instance, a bias current may be employed where the current cells are in a state of almost being turned off. In some embodiments, the method 500 may be combined with other DAC techniques (e.g., using Class B, Class AB, Class G, among others).

As disclosed above, certain embodiments are disclosed where an interleaved, return-to-zero operation of a Class B DAC is employed with two banks of current sources, one of the banks off while the other is on, where activation of the current cells alternates between each bank for each clock cycle. If the input signal is DC, all of the current sources in bank A, for instance, switch off while one or more (e.g., the same number) current sources in bank B switch on simultaneously. Also, compared to conventional return-to-zero operations, which requires a time for all cells to be turned off, the interleaving return-to-zero operation of the disclosed embodiments does not fundamentally change the output signal (e.g., no loss of signal power, and the signal within Nyquist remains untouched, and above Nyquist is only slightly modified). Note that in some embodiments, there may be a time delay imposed between activation (e.g., shut off cells of one set and after a delay turn on cells of the second set), and hence simultaneous actions of turning on and off may no longer be implemented (i.e., no simultaneous switching). It should be appreciated that, although this alternative implementation may lower the output signal power in the Nyquist band, such an implementation may facilitate some applications involving particular signal shaping. Further, if the time delay is small, any potential negative effects may be minimized.

It should be emphasized that the above-described embodiments of the present disclosure are merely possible examples of implementations, merely set forth for a clear understanding of the principles set forth herein. Many variations and modifications may be made to the above-described embodiment(s) without departing substantially from the spirit and scope. All such modifications and variations are intended to be included herein within the scope of this disclosure and protected by the following claims.

At least the following is claimed:

1. An apparatus, comprising:
   a first bank of plural first current cells configured to provide a positive current output and a negative current output; and
   a second bank of plural second current cells configured to provide a positive current output and a negative current output, the plural first and second current cells configured to be selectively activated based at least in part on an input clock, the first bank and the second bank configured to be alternately activated.

2. The apparatus of claim 1, wherein each of the first and second current cells comprises a current source coupled to a switch or switching mechanism.

3. The apparatus of claim 2, wherein the current source and the switch collectively comprise either stacked transistors or stacked transistors that include a cascode configuration.

4. The apparatus of claim 1, wherein the first and second current cells are configured to be selectively activated based at least in part on each receiving an input code during a given clock cycle.

5. The apparatus of claim 1, wherein the first bank is configured to provide an output when activated while simultaneously all of the second current cells of the second bank are turned off, and wherein the second bank is configured to provide an output when activated while simultaneously all of the first current cells of the first bank are turned off.

6. The apparatus of claim 1, wherein the first bank is configured to provide an output when activated while simultaneously all of the second current cells of the second bank comprise a state of almost being turned off, and wherein the second bank is configured to provide an output when activated while simultaneously all of the first current cells of the first bank comprise the state of almost being turned off.

7. The apparatus of claim 1, further comprising additional, similarly configured first and second banks.

8. The apparatus of claim 1, wherein the apparatus comprises either a Class B current digital-to-analog converter (DAC) or a non-Class B DAC.

9. The apparatus of claim 1, wherein the first bank is configured to be activated during a first clock cycle and the second bank is configured to be activated during a second clock cycle that immediately follows the first clock cycle.

10. The apparatus of claim 1, wherein the first and second banks are configured to be alternately activated based at least in part on an interleaved, return-to-zero manner of operation.

11. The apparatus of claim 1, wherein the first and second banks are configured as either a pull arrangement or a push-pull arrangement.

12. The apparatus of claim 1, wherein the first and second banks are configured to receive a data signal comprising a frequency approximately at or above 1 Giga-Hertz (GHz).

13. A method, comprising:
   receiving a data signal; and
   converting the data signal to an analog signal over plural clock cycles, the converting comprising:
      during a first clock cycle of the plural clock cycles, switching on one or more first current cells of a first bank while simultaneously a second bank comprising second current cells is switched off or almost off; and
      during a second clock cycle of the plural clock cycles, the second clock cycle immediately subsequent to the first clock cycle, switching on one or more of the second current cells of the second bank while simultaneously the first bank is switched off or almost off.

14. The method of claim 13, wherein the switching comprises receiving an input code that selectively activates one or more of the current cells of the first and second banks.

15. The method of claim 13, wherein the switching on and off of the banks comprises an interleaving return-to-zero process.

16. The method of claim 13, further comprising outputting current according to positive and negative polarities.

17. The method of claim 13, wherein each of the first and second current cells comprises a current source coupled to a switch, the current source and the switch collectively comprising plural transistors in either a stacked transistor arrangement or a stacked arrangement that includes a cascode arrangement.

18. The method of claim 13, wherein the method is implemented in either a Class B current digital-to-analog converter (DAC) or a Class AB DAC.

19. A system, comprising:
   clocking circuitry configured to provide a clocking signal over plural clock cycles comprising a first clock cycle and a second clock cycle immediately subsequent to the first clock cycle; and
   an interleaving, return-to-zero (IRZ) digital-to-analog converter (DAC) coupled to the clocking circuitry and configured to:
      receive a data signal; and
      convert the data signal to an analog current output signal over the plural clock cycles, the DAC configured to convert by:

during the first clock cycle, switching on one or more first current cells of a first bank while a second bank comprising second current cells is switched off or almost off; and during the second clock cycle, switching on one or more of the second current cells of the second bank while the first bank is switched off or almost off.

20. The system of claim 19, wherein the IRZ DAC comprises either a Class B DAC or a Class AB DAC.

* * * * *